(12) United States Patent
Ljungberg

(10) Patent No.: US 6,673,393 B2
(45) Date of Patent: Jan. 6, 2004

(54) OXIDE COATED CUTTING TOOL

(75) Inventor: Björn Ljungberg, Enskede (SE)

(73) Assignee: Sandvik AB, Sandviken (SE)

( * ) Notice: Subject to any disclaimer, the term of this patent is extended or adjusted under 35 U.S.C. 154(b) by 0 days.

(21) Appl. No.: 10/155,168

(22) Filed: May 28, 2002

(65) Prior Publication Data

US 2003/0008181 A1 Jan. 9, 2003

(30) Foreign Application Priority Data

May 30, 2001 (SE) .............................................. 0101902

(51) Int. Cl.⁷ .............................................. C23C 16/00
(52) U.S. Cl. ......................... 427/255.31; 427/255.393; 427/255.7; 427/419.3
(58) Field of Search ....................... 427/255.29, 255.31, 427/255.39, 255.393, 255.7, 419.3

(56) References Cited

U.S. PATENT DOCUMENTS

| | | |
|---|---|---|
| 4,984,940 A | 1/1991 | Bryant et al. |
| 5,487,625 A | 1/1996 | Ljungberg et al. |
| 5,674,564 A | 10/1997 | Ljungberg et al. |
| 5,700,569 A | 12/1997 | Ruppi |
| 5,763,008 A | 6/1998 | Sarin et al. |
| 5,766,782 A | 6/1998 | Ljungberg |
| 5,786,069 A | 7/1998 | Ljungberg et al. |
| 6,090,476 A | 7/2000 | Thysell et al. |
| 2002/0122701 A1 | 9/2002 | Ljungberg et al. |

FOREIGN PATENT DOCUMENTS

WO     01/40541 A1     6/2001

OTHER PUBLICATIONS

S. Ruppi et al., "Microstructure and deposition characteristics of k–$Al_2O_3$", Proceedings of the $12^{th}$ European CVD Conference, *J. Phys. IV* France 9 (1999), pp. Pr8–349–Pr8–355, published by EDP Sciences, Les Ulis Cedex A, France. No month (avail.).

Björn Ljungberg, et al., U.S. application No. 09/985,407, filed on Nov. 2, 2001.

*Primary Examiner*—Bernard Pianalto
(74) *Attorney, Agent, or Firm*—Burns, Doane, Swecker & Mathis, LLP

(57) ABSTRACT

A body is at least partially coated with one or more refractory layers of which at least one layer is of a finegrained $\kappa$-$Al_2O_3$. Said $\kappa$-$Al_2O_3$ layer has equiaxed grains with an average grain size of <0.5 μm. The $Al_2O_3$ layer also has at least one sublayer containing Al, Si and O. The finegrained $\kappa$-$Al_2O_3$ microstructure is obtained by periodically introducing a silicon halide, preferably $SiCl_4$, during the $Al_2O_3$-process.

5 Claims, 2 Drawing Sheets

OXIDE COATED CUTTING TOOL

This application claims priority under 35 U.S.C. §§119 and/or 365 to 0101902-5 filed in Sweden on May 30, 2001; the entire content of which is hereby incorporated by reference.

FIELD OF THE INVENTION

The present invention relates to a coated cutting tool for chipforming machining. The coating includes at least one alumina ($Al_2O_3$) layer characterized by fine, equiaxed grains.

BACKGROUND OF THE INVENTION

In the description of the background of the present invention that follows reference is made to certain structures and methods, however, such references should not necessarily be construed as an admission that these structures and methods qualify as prior art under the applicable statutory provisions. Applicants reserve the right to demonstrate that any of the referenced subject matter does not constitute prior art with regard to the present invention.

Cemented carbide cutting tools coated with various types of $Al_2O_3$ layers using Chemical Vapour Deposition (CVD), e.g., pure $\kappa$-$Al_2O_3$, mixtures of $\kappa$- and $\alpha$-$Al_2O_3$ coarse grained $\alpha$-$Al_2O_3$ and finegrained textured $\alpha$-$Al_2O_3$ have been commercially available for years generally in multilayer combinations with other metal carbide and/or nitride layers, the metal being selected from transition metals of the IVB, VB and VIB groups of the Periodic Table.

$Al_2O_3$ crystallises in several different phases: $\alpha$, $\kappa$, $\gamma$, $\delta$, $\theta$ etc. The two most frequently occurring phases of CVD-produced wear resistant layers are the thermodynamically stable, $\alpha$-phase and the metastable $\kappa$-phase or a mixture thereof. Generally, the $\kappa$-phase exhibits a grainsize in the range 0.5–3.0 $\mu$m (dependent on the layer thickness) and the grains predominately grow through the whole coating forming a columnar type coating morphology.

Furthermore, the $\kappa$-$Al_2O_3$ layers are free from crystallographic defects and also free from micropores and voids. Coarse grained (3–6 $\mu$m) $\alpha$-$Al_2O_3$ often possesses porosity and crystallographic defects, while finegrained textured $\alpha$-$Al_2O_3$ are free of defects with very pronounced columnar-shaped grains.

In U.S. Pat. No. 5,674,564 a method is disclosed of growing a fine-grained $\kappa$-$Al_2O_3$ layer by employing a low deposition temperature and a high concentration of a sulphur compound.

In U.S. Pat. No. 5,487,625 a method is disclosed for obtaining a finegrained, (012)-textured $\alpha$-$Al_2O_3$ layer consisting of columnar grains with a small cross section (about 1 $\mu$m).

In U.S. Pat. No. 5,766,782 a method is disclosed for obtaining a columnar fine-grained (104)-textured $\alpha$-$Al_2O_3$ layer.

The lifetime and the performance of a coated cutting tool are closely related to the microstructure of the coating materials used. Although, coatings produced according to above-mentioned prior art patents show good cutting properties there is still a strong desire to further improve coating microstructures to suit specific cutting conditions and workpiece materials.

As has been mentioned above, all $Al_2O_3$ layers produced by the CVD technique possess a more or less columnarlike grainstructure. An $Al_2O_3$ layer with an equiaxed grainstructure is, however, expected to show some favourable mechanical properties, e.g., resistance to crack propagation and higher cutting edge toughness, as compared to a layer with a columnar grainstructure. In addition, finegrained layers generally have smoother surfaces than coarse grained layers. During cutting less workpiece materials will adhere onto a smooth coating surface which in turn will imply lower cutting forces and less tendency for the coating to flake off. Nowadays coated cutting inserts are often brushed with SiC based brushes or blasted with finegrained $Al_2O_3$ powder in order to obtain a smooth coating surfaces, a rather costly production step.

One well-known and possible technique to produce a finegrained structure and to restrain a columnar grain growth is to deposit a so-called multilayer structure in which the columnar growth of, e.g., $Al_2O_3$, is periodically interrupted by the growth of a 0.05–1 $\mu$m thick layer of a different material such as disclosed in U.S. Pat. No. 4,984,940 and U.S. Pat. No. 5,700,569. The latter layer should preferably have a different crystal structure or at least different lattice spacings in order to be able to initiate renucleation of the original layer. One example of such a technique is when the $Al_2O_3$ growth periodically is interrupted by a short TiN deposition process resulting in a ($Al_2O_3$+TiN)xn multilayer structure with a thickness of each individual TiN layer in the range 0.1–1 $\mu$m, e.g., see Proceedings of the 12th European CVD Conference page pr. 8–349. However such multilayer structures very often suffer from a low adherence between the two different types of layers.

In Swedish patent application SE 0004272-1 a method is disclosed for obtaining a finegrained $\alpha$-$Al_2O_3$ layer consisting of essentially equiaxed grains with a grain size <1 $\mu$m. The grain refinement is accomplished by periodically interrupting the $Al_2O_3$ process and treating the $Al_2O_3$ surface with a mixture of $TiCl_4/H_2$. When the $Al_2O_3$ process is restarted renucleation of the $\alpha$-$Al_2O_3$ will take place.

It is not possible to use this method to produce finegrained $\kappa$-$Al_2O_3$ since only the $\alpha$-$Al_2O_3$ phase will nucleate on the $TiCl_4/H_2$ treated $Al_2O_3$ surface.

$\kappa$-$Al_2O_3$ and $\alpha$-$Al_2O_3$ coatings used as tool materials have slightly different wear properties when cutting different materials. It is therefore also desirable to have means to produce finegrained $\kappa$-$Al_2O_3$ with a controllable grain structure.

SUMMARY OF THE INVENTION

It is the object of the present invention to provide onto a hard substrate, or preferably onto a hard substrate coated with a $TiC_xN_yO_z$ and/or $ZrC_xN_yO_z$-layer (x+y+z=1 and x,y,z$\geq$0) at least one finegrained single phase $\kappa$-$Al_2O_3$ layer with a microstructure which is different from the prior art columnar $\kappa$-$Al_2O_3$ CVD layers mentioned above.

It is also the object of the present invention to provide a high performance tool coating comprising the invented $Al_2O_3$ layer.

It is a further object of the invention to provide an alumina coated cutting tool insert with improved cutting performance in steel and nodular cast iron.

According to one aspect of the present invention there is provided a cutting tool comprising a body of sintered cemented carbide, cermet or ceramic, and a hard and wear resistant coating applied on at least a functioning portion of a surface of the body. The coating comprises a structure of one or more refractory layers of which at least one layer consists essentially of an equiaxed finegrained $\kappa$-$Al_2O_3$ with a thickness of 0.5–25 $\mu$m and with a grain size of less than 0.5 μm, and said finegrained κ-$Al_2O_3$ layer comprises at least one sub-layer with a thickness between 0.02 and 3 μm containing Al, Si and O with a Si concentration between 4–34 at %, Al concentration of 0–37 at % and O concentration of 60–67 at %.

According to another aspect, the present invention provides a method of coating a body with at least one finegrained κ-$Al_2O_3$ layer comprising contacting the body with a reaction mixture comprising a hydrogen carrier gas, one or more halides of aluminium and a hydrolysing and/or oxidising agent at 800–1050° C., adding a sulphur agent to the reaction mixture to enhance the growth rate, and depositing at least one silicon enriched sublayer in the κ-$Al_2O_3$ layer by periodically introducing a silicon halide.

BRIEF DESCRIPTION OF THE DRAWINGS

FIG. 1a shows an SEM micrograph of an $Al_2O_3$ layer according to the present invention at a high magnification in top view projection.

FIG. 2a shows an SEM micrograph at a high magnification in top view projection and FIG. 2b shows an SEM micrograph in so called backscatter mode at high magnification of a polished cross-section.

FIG. 3a shows an SEM micrograph at a high magnification in top view projection and FIG. 3b shows an SEM micrograph in so called backscatter mode at high magnification of a polished cross-section.

DETAILED DESCRIPTION OF THE INVENTION

Figure 1A:
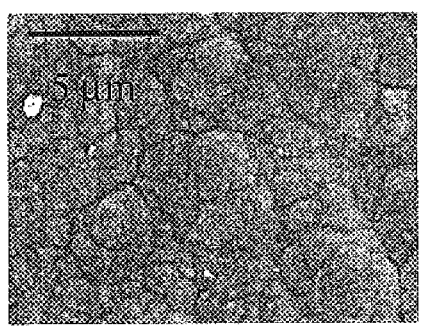
FIGS. 1a, b and c show Scanning Electron Microscope (SEM) micrographs of the present invention.
Figure 1B:
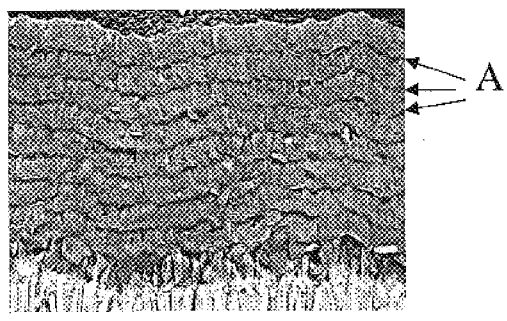
FIG. 1b shows an SEM micrograph of a cross sectioned sample according to the present invention at a high magnification.

Surprisingly, it has been found that a non-columnar, finegrained, equiaxed κ-$Al_2O_3$ layer can be deposited by repeatedly introducing a controlled amount of a silicon halide, preferably $SiCl_4$, during an $Al_2O_3$-deposition process The duration of the treatment periods as well as the silicon halide concentration are important parameters which must be optimised in order to obtain the desired result. If the silicon halide concentration is too low or/and treatment time is too short, the renucleation of the $Al_2O_3$ layer will not be sufficiently dense to cover a sufficient portion of the whole coating surface. If, on the other hand, the silicon halide concentration is too high and/or the treatment time is too long, the cohesion between the grains will be too weak resulting in a low quality coating.

The method of the present invention thus relates to the coating of a body with a κ-$Al_2O_3$ layer during which the body is brought in contact with a hydrogen carrier gas containing one or more halides of aluminium, preferably $AlCl_3$, and a hydrolysing and/or oxidising agent, preferably $CO_2$, at temperature of the body between 800 and 1050° C. During the $Al_2O_3$ growth, a silicon halide, preferably $SiCl_4$, is added to the reaction mixture at intervals of 1–5 minutes in a concentration of 20–50% of the $AlCl_3$ flow. This procedure is repeatedly carried out in order to obtain a finegrained κ-$Al_2O_3$ layer structure with the desired grainsize.

In contrast to the columnar grains of prior art $Al_2O_3$ layers, the grains of the κ-$Al_2O_3$ layers according to the present invention are essentially equiaxed. The resulting grainsize and the distribution of the same are dependent on the number of $SiCl_4$ treatments carried out. The more frequently the $Al_2O_3$ process is subjected to $SiCl_4$ treatments, the smaller the $Al_2O_3$ grains will be. Up to 200 $SiCl_4$ treatments are possible to be carried out, however, generally less than 100 treatments are preferred. The introduction of $SiCl_4$ will initiate a growth of a super finegrained layer comprising Al, Si and O in concentrations, which are dependent on the used $AlCl_3/SiCl_4$-flow ratio. When the $SiCl_4$-flow is turned off, renucleation of κ-$Al_2O_3$ grains will take place.

One advantage of the invented method is that only one foreign element (Si) can be added during the $Al_2O_3$ process in order to create the grain refinement, this is in contrast to prior art techniques which use renucleation layers consisting of TiN or $(Ti_x,Al_y)(C_z,O_w,N_j)$ which is quite different materials from $Al_2O_3$.

The resulted grainsize of the κ-$Al_2O_3$ layer can be determined from a SEM micrograph at high magnification taken from cross-sectioned samples.

More specifically, the coated body comprises a cutting tool with a substrate of cemented carbide, cermet or a ceramic and a coating consisting of a hard wear resistant material and in said coating at least one layer is essentially a single phase finegrained κ-$Al_2O_3$ with a thickness of 0.5–25 μm and with a grain size of less than 0.5 μm. The finegrained κ-$Al_2O_3$ layer comprises at least one sublayer with a thickness between 0.02 and 3 μm containing Al, Si and O. The Si concentration is in the range 4–34 at %, the Al concentration in the range 0–37 at % and the O concentration in the range 60–67 at %. The other layers in the coating structure may be α-$Al_2O_3$, prior art coarse grained κ-$Al_2O_3$ (0.5–3.5 μm), $ZrO_2$, TiC or related carbide, nitride, carbonitride, oxycarbide and oxycar-bonitride of a metal selected from the Groups IVB, VB, and VIB of the Periodic Table, the elements B, Al and Si and/or mixtures thereof. Such other layers may be deposited by CVD, PACVD (Plasma CVD), PVD (Physical Vapour Deposition) or MT-CVD (Moderate Temperature CVD). At least one of such other layers is in contact with the substrate. The total thickness of the coating of the cutting tool can vary between 1 and 30 μm.

Aluminium, silicon and oxygen may exist together in some minerals like andalusite, silliminite, kayanite and mullite ($Al_6Si_4O_{13}$). A method to deposit mullite coatings by CVD is disclosed in U.S. Pat. No. 5,763,008, a gas mixture of $AlCl_3$, $SiCl_4$, $CO_2$ and $H_2$ is used. The present invention uses the same chemical compounds but a sulphur compound is added to form and control the growth of the mentioned sublayer containing silicon. Under the invented process conditions, no mullite has been observed.

EXAMPLE

A) Cemented carbide cutting inserts in style CNMG 120408-PM with the composition 7.5 weight-% Co, 1.8 wt % TiC, 0.5 wt % TiN, 3 wt % TaC, 0.4 wt % NbC and balance WC were coated with a 1 μm thick layer of TiN using conventional CVD-technique followed by a 6 μm TiCN layer employing the MTCVD-technique using $TiCl_4$, $H_2$, $N_2$ and $CH_3CN$ as process gasses. In subsequent process steps during the same coating cycle, a 0.5 μm $TiC_xN_yO_z$ layer with an approximate composition corresponding to x=0.5, y=0.3 and z=0.2 was deposited followed by a 6 μm thick layer of κ-$Al_2O_3$ deposited according to the invented coating process. Prior to the nucleation of the $Al_2O_3$ the oxidation potential of the carrier gas $H_2$ (only gas present in the reactor), i.e., the water vapour concentration, was explicitly set forth to a low level, such as than 5 ppm. Then the $Al_2O_3$-process was started up. The process conditions during the $Al_2O_3$ deposition were as below:

| Step | 1 | 2 | 3 | 4 |
|---|---|---|---|---|
| $CO_2$: | 4% | 4% | 4% | 4% |
| $AlCl_3$: | 4% | 4% | 4% | 4% |
| $H_2S$ | — | 0.15 | 0.2% | 0.2% |
| HCl | 1.5% | 5% | 5% | 5% |
| $H_2$ | balance | balance | balance | balance |
| $SiCl_4$ | — | — | — | 2% |
| Pressure: | 60 mbar | 60 mbar | 60 mbar | 60 mbar |
| Temperature: | 1000° C. | 1000° C. | 1000° C. | 1000° C. |
| Duration: | 30 min | 20 min | 22 min | 2 min |

The $Al_2O_3$ layer was deposited by proceeding through step 1, 2, 3 and 4 and then looping between step 4 and step 3 eight times. Hence, the $Al_2O_3$-process was treated with $SiCl_4$ altogether nine times.

XRD-analysis of the deposited $Al_2O_3$ layer showed that it consisted essentially of the kappa phase. No diffraction peaks from the mullite-phase ($Al_6Si_2O_{13}$) could be detected.

Figure 1C:
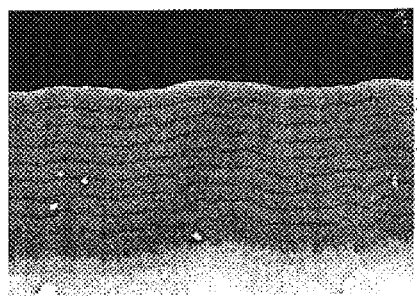
FIG. 1c shows an SEM micrograph of a polished cross-section of an $Al_2O_3$ layer with Si-rich layers, A, according to the present invention in so called backscatter mode at high magnification.
Figure 4:
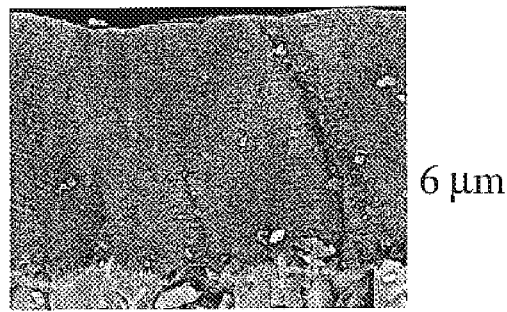
FIG. 4 shows a SEM micrograph of a cross sectioned sample according to the present invention.

From the SEM-micrographs taken from a polished cross sectioned sample, similar to FIG. 1c, it was possible to observe nine $Al_2O_3$-layers with a thickness of approx. 0.5 μm and nine extremely finegrained layers corresponding to the $SiCl_4$-treatment steps 4 with a thickness of approx. 0.15 μm. The grainsize was estimated from a fractured sample at 70,000 times magnification to be 0.5 μm for the $Al_2O_3$-layers and less than 0.1 μm for the Si containing layers. The inserts appeared multicoloured due to light interference in the transparent layer structure. The coating surfaces were very smooth.

A chemical analysis of the thin sublayers was carried out on a cross sectioned sample in a Hitachi S-4300 FEG-SEM equipped with an EDS-system with a Link Si(Li)-detector. The analysis resulted in the following estimated concentrations Al=32 at %, Si=8 at % and O=60 at %.

B) Cemented carbide cutting inserts in style CNMG 120408-PM with the same composition as in A) were coated with a 1 μm thick layer of TiN using conventional CVD-technique followed by a 6 μm TiCN layer employing the MTCVD-technique using $TiCl_4$, H2, $N_2$ and $CH_3CN$ as process gasses. In subsequent process steps during the same coating cycle, a 0.5 μm $TiC_xN_yO_z$ layer with an approximate composition corresponding to x=0.5, y=0.3 and z=0.2 was deposited followed by a 6 μm thick layer of κ-$Al_2O_3$ deposited according to the invented coating process. Prior to the nucleation of the $Al_2O_3$ the oxidation potential of the carrier gas $H_2$ (only gas present in the reactor), i.e., the water vapour concentration, was explicitly set forth to a low level, such as less than 5 ppm.

Then the first $Al_2O_3$ layer step 1 was started up. The process conditions during the $Al_2O_3$ deposition were as below:

| Step | 1 | 2 | 4 |
|---|---|---|---|
| $CO_2$: | 4% | 4% | 4% |
| $AlCl_3$: | 4% | 4% | 4% |
| $H_2S$ | — | 0.2% | 0.2% |
| HCl | 1.5% | 5% | 5% |
| $H_2$ | balance | balance | balance |
| $SiCl_4$ | — | — | 2% |
| Pressure: | 60 mbar | 60 mbar | 60 mbar |
| Temperature: | 1000° C. | 1000° C. | 1000° C. |
| Duration: | 30 min | 5 min | 1.5 min |

The $Al_2O_3$ layer was deposited by proceeding through step 1, 2 and 3 and then looping between step 3 and step 2 altogether 35 times. Hence, the $Al_2O_3$-process was treated with $SiCl_4$ altogether 36 times.

XRD-analysis of the deposited $Al_2O_3$ layer showed that it consisted essentially of the kappa phase. No diffraction peaks from the mullite-phase ($Al_6Si_2O_{13}$) could be detected.

From a SEM-micrograph taken from a cross sectioned sample at a magnification of 70,000 times, the grainsize was estimated to be 0.13 μm for the $Al_2O_3$ layers and less than 0.04 μm for the layers corresponding to the $SiCl_4$ treatment steps 3. The inserts appeared violet/green in colour and had extremely smooth coating surfaces.

Figure 2A:
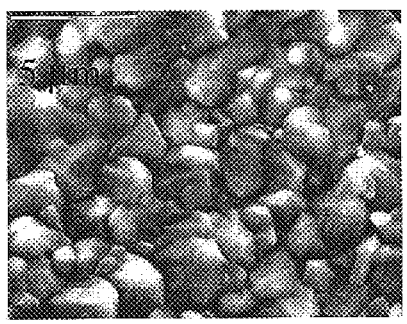
FIGS. 2a–b show SEM micrographs of a prior art κ-$Al_2O_3$ layer.
Figure 3A:
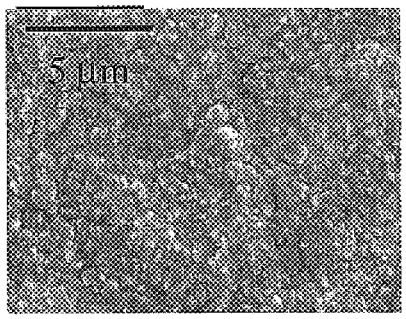
FIGS. 3a–b show SEM micrographs of a prior art multilayer κ-$Al_2O_3$+TiN coating.
Figure 2B:
Figure 3B:
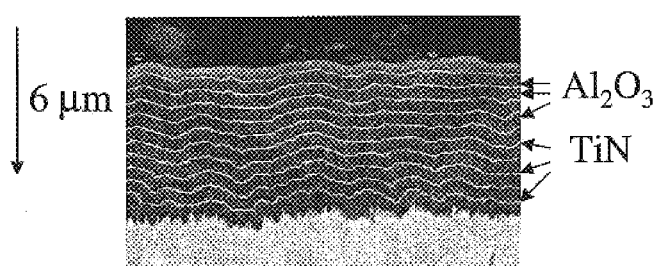

C) The cemented carbide substrate of A) was coated with TiCN (5 μm), a 0.5 μm $TiC_xN_yO_z$ layer and 6 μm $Al_2O_3$ as set forth in A) except for that the $Al_2O_3$ process was carried out according to prior art technique that is, only step 1 and 2 as described under A) and the process time of step 2 was 290 min. This resulted in an $Al_2O_3$ layer consisting essentially of the κ-$Al_2O_3$ phase with an average grainsize of about 2 μm with a grain structure similar to what is shown in FIG. 2a.

D) The cemented carbide substrate of A) was coated with TiCN (5 μm), a 0.5 μm $TiC_xN_yO_z$ layer and a 6 μm of multilayered $Al_2O_3$/TiN-coating as below:

| Step | 1 | 2 | 3 | 4 |
|---|---|---|---|---|
| $CO_2$: | 4% | 4% | 0% | 4% |
| $AlCl_3$: | 4% | 4% | 0% | 4% |
| $H_2S$ | — | 0.2% | 0% | 0.2% |
| HCl | 1.5% | 5% | 0% | 5% |
| $H_2$ | balance | balance | balance | balance |
| $TiCl_4$ | — | — | 2% | — |
| $N_2$ | — | — | 40% | — |
| Pressure: | 60 mbar | 60 mbar | 60 mbar | 60 mbar |
| Temperature: | 1000° C. | 1000° C. | 1000° C. | 1000° C. |
| Duration: | 30 min | 20 min | 3 min | 20 min |

The $Al_2O_3$ layer was deposited by proceeding through step 1, 2, 3 and 4 and then looping between step 4 and step 3 nine times. Hence, the $Al_2O_3$-process was interrupted ten times by a TiN-process.

This resulted in a multilayer coating consisting of 11 layers of $Al_2O_3$ and 10 thin layers of TiN. The $Al_2O_3$ layer was determined to consist of essentially the kappa phase.

Some of the inserts from A), B), C) and D) were brushed with a cylindrical nylon brush containing SiC grains.

Brushed and unbrushed cutting inserts from A), B), C) and D) were then tested with respect to edge line and rake face flaking in two types of workpiece materials under different cutting conditions.

Cutting operation 1: A facing operation in nodular cast iron (AISI 60-40-18, DIN CGC40). The shape of the machined workpiece was such that the cutting edge was out of cut twice per revolution of the workpiece.

Cutting data:

Speed=160 m/min,

Feed=0.1 mm/rev.

Depth of cut=2.0 mm

The inserts were run one cut over the face of the workpiece. This test is very decisive and demanding when cutting nodular cast iron.

The percentage of the edge line in cut that obtained flaking was recorded for each insert tested as well as to what extent flaking occurred on the rake face of the cutting insert. The results are expressed in Table 1 below as an average value of the four inserts (four edges).

Cutting operation 2: A facing operation in an alloyed steel (AISI 1518,W-no 1.0580). The shape of the workpiece was such that the cutting edge was out of cut three times per revolution.

Cutting data:

| Speed: | 130–220 m/min |
| Feed: | 0.2 mm/rev. |
| Depth of cut: | 2.0 mm |

Five inserts (edges) were run one cut over the workpiece. The results in Table 2 are expressed as percentage of the edge-line in cut that obtained flaking of the coating.

TABLE 1

| Cutting operation 1 | |
| --- | --- |
| Variant | Edge line flaking |
| A unbrushed (acc. to invention) | 5% |
| A brushed (acc. to invention) | 0% |
| B unbrushed (acc. to invention) | 0% |
| B brushed (acc. to invention) | 0% |
| C unbrushed (prior art) | 65% |
| C brushed (prior art) | 5% |
| D unbrushed (prior art) | 30% |
| D brushed (prior art) | 0% |

TABLE 2

| Cutting operation 2 | | |
| --- | --- | --- |
| Variant | Edge line flaking | Rake face Flaking |
| A brushed (acc. to invention) | 5% | Only spot wise $Al_2O_3$ Flaking |
| B brushed (acc. to invention) | 3% | Only spot wise $Al_2O_3$ Flaking |
| C brushed (prior art) | 90% | Severe $Al_2O_3$ flaking |
| D brushed (prior art) | 70% | Flaking of $Al_2O_3$ and step wise between TiN and $Al_2O_3$ layers |

The results from Table 1 show that unbrushed coatings according to the present invention work equally well as the brushed inserts in alloyed steel and results in Table 2 show that the inserts according to invention also work surprisingly well in nodular cast iron and far better than prior art inserts.

I claim:

1. A method of coating a body with at least one finegrained κ-$Al_2O_3$ layer, the method comprising:

contacting the body with a reaction mixture comprising a hydrogen carrier gas, one or more halides of aluminium and a hydrolysing and/or oxidising agent at 800–1050 C;

adding a sulphur agent to the reaction mixture to enhance the growth rate; and depositing a κ-$Al_2O_3$ layer comprising at least one silicon enriched sublayer by periodically introducing a silicon halide.

2. The method according to claim 1, wherein the one or more halide of aluminum is $AlCl_3$.

3. The method according to claim 1, wherein the oxidising agent is $CO_2$.

4. The method according to claim 1, wherein the sulphur agent is $H_2S$.

5. The method according to claim 1, wherein the silicon halide is $SiCl_4$.

* * * * *